(12) United States Patent
Yazaki

(10) Patent No.: US 10,930,435 B2
(45) Date of Patent: Feb. 23, 2021

(54) MULTILAYER ELEMENT AND LC FILTER

(71) Applicant: Murata Manufacturing Co., Ltd., Nagaokakyo (JP)

(72) Inventor: Hirokazu Yazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/680,756

(22) Filed: Nov. 12, 2019

(65) Prior Publication Data

US 2020/0082982 A1  Mar. 12, 2020

Related U.S. Application Data

(63) Continuation of application No. PCT/JP2018/020249, filed on May 25, 2018.

(30) Foreign Application Priority Data

Jun. 19, 2017 (JP) .............................. JP2017-119296

(51) Int. Cl.
| | |
|---|---|
| *H01G 4/232* | (2006.01) |
| *H03H 7/01* | (2006.01) |
| *H01L 23/538* | (2006.01) |
| *H03H 1/00* | (2006.01) |

(52) U.S. Cl.
CPC ......... *H01G 4/232* (2013.01); *H01L 23/5383* (2013.01); *H03H 7/0115* (2013.01); *H03H 2001/0085* (2013.01); *H05K 2201/1053* (2013.01)

(58) Field of Classification Search
CPC ......... H03H 2001/0085; H03H 7/0115; H01G 4/232

USPC .................................................. 333/175, 185
See application file for complete search history.

(56) References Cited

U.S. PATENT DOCUMENTS

| 6,133,809 A | 10/2000 | Tomohiro et al. | |
|---|---|---|---|
| 6,288,887 B1 * | 9/2001 | Yoshida ............... | H05K 3/3426 361/306.1 |
| 2003/0030510 A1 * | 2/2003 | Sasaki .................. | H03H 7/0115 333/185 |
| 2004/0223290 A1 | 11/2004 | Sutardja | |

(Continued)

FOREIGN PATENT DOCUMENTS

| JP | 02-288298 A | 11/1990 |
|---|---|---|
| JP | 07-78728 A | 3/1995 |

(Continued)

OTHER PUBLICATIONS

Official Communication issued in International Patent Application No. PCT/JP2018/020249, dated Jul. 24, 2018.

*Primary Examiner* — Rakesh B Patel
(74) *Attorney, Agent, or Firm* — Keating & Bennett, LLP

(57) ABSTRACT

A multilayer element includes a multilayer body defined by stacking base layers, inductor electrodes, a capacitor electrode on an outer portion, and outer terminals. Inductors are defined using the inductor electrodes. The inductors are connected between the outer terminals, and the inductors are connected to the capacitor electrode. The multilayer element may be easily used to make an LC filter by placing a metal shield opposite a capacitor electrode to define a capacitance between the capacitor electrode and the metal shield.

17 Claims, 15 Drawing Sheets

(56) References Cited

U.S. PATENT DOCUMENTS

| | | | |
|---|---|---|---|
| 2009/0189714 A1* | 7/2009 | Sakisaka | H03H 7/1758 |
| | | | 333/185 |
| 2010/0033267 A1* | 2/2010 | Mizutani | H03H 7/075 |
| | | | 333/176 |
| 2013/0009726 A1 | 1/2013 | Sasaki | |
| 2017/0290143 A1 | 10/2017 | Ito | |

FOREIGN PATENT DOCUMENTS

| | | |
|---|---|---|
| JP | 07-106896 A | 4/1995 |
| JP | 09-293612 A | 11/1997 |
| JP | 2000-196391 A | 7/2000 |
| JP | 2008-022017 A | 1/2008 |
| JP | 2013-021449 A | 1/2013 |
| JP | 2017-092177 A | 5/2017 |
| WO | 2016/121629 A1 | 8/2016 |

* cited by examiner

1a・1b・1d・1e・1f:MAGNETIC CERAMIC
1c:NON-MAGNETIC CERAMIC

1a~1f: MAGNETIC CERAMIC
1g: HIGH DIELECTRIC CONSTANT CERAMIC

PRIOR ART  1100

MULTILAYER ELEMENT AND LC FILTER

CROSS REFERENCE TO RELATED APPLICATIONS

This application claims the benefit of priority to Japanese Patent Application No. 2017-119296 filed on Jun. 19, 2017 and is a Continuation Application of PCT Application No. PCT/JP2018/020249 filed on May 25, 2018. The entire contents of each application are hereby incorporated herein by reference.

BACKGROUND OF THE INVENTION

1. Field of the Invention

The present invention relates to a multilayer element that includes at least one inductor defined by an inductor electrode, and at least one capacitor electrode.

The present invention also relates to an LC filter including the multilayer element.

2. Description of the Related Art

An LC filter in which an inductor and a capacitor are formed inside a multilayer body is widely used in electronic devices, such as communication devices. Such an LC filter is disclosed in Japanese Unexamined Patent Application Publication No. 2013-21449. FIG. 16A illustrates an LC filter (low pass filter) 1100 disclosed in Japanese Unexamined Patent Application Publication No. 2013-21449.

The LC filter 1100 includes a multilayer body 102 formed by stacking a plurality of base layers (insulator layers) 101*a* to 101*j*. Inductor electrodes (coil conductors) 103 and capacitor electrodes (capacitor conductors) 104 are formed, as necessary, between adjacent ones of the base layers 101*a* to 101*j*.

In the LC filter 1100, a plurality of inductor electrodes 103 are connected by via electrodes (via hole conductors) 105 to form inductors inside the multilayer body 102. Also in the LC filter 1100, a pair of opposite capacitor electrodes 104 forms capacitors inside the multilayer body 102. The LC filter 1100 thus forms an LC filter (low pass filter) having an equivalent circuit illustrated in FIG. 16B.

In the LC filter 1100, where all the inductor electrodes 103 forming the inductors and all the capacitor electrodes 104 forming the capacitors are disposed inside the multilayer body 102, it is difficult to arrange (or design the arrangement of) the inductor electrodes 103 and the capacitor electrodes 104. That is, since all the inductor electrodes 103 and all the capacitor electrodes 104 need to be arranged inside the multilayer body 102 without interference with each other and, at the same time, need to be extended outward without interference with each other, it is difficult to arrange the electrodes inside the multilayer body 102. Also, in the LC filter 1100, since all the inductor electrodes 103 and all the capacitor electrodes 104 are arranged inside the multilayer body 102 without interference with each other and are extended outward without interference with each other, the size of the multilayer body 102 may be increased.

Additionally, no measures have been taken to reduce entry of noise from outside into the LC filter 1100, and to reduce emission of noise from inside to the outside of the LC filter 1100. Noise entering the LC filter 1100 from the outside may cause the LC filter 1100 to malfunction, whereas noise emitted from inside the LC filter 1100 to the outside may affect the functions of other electronic components mounted adjacent to the LC filter 1100.

SUMMARY OF THE INVENTION

Preferred embodiments of the present invention provide multilayer bodies defined by stacking a plurality of base layers, the multilayer body including an outer portion including a mounting surface, a top surface, and a plurality of side surfaces connecting the mounting surface to the top surface, at least one inductor electrode between adjacent ones of the base layers, at least one capacitor electrode on the outer portion or between adjacent ones of the base layers to be closer to the top surface than the inductor electrode is, and at least two outer terminals that connect to an external connector, the outer terminals being on the outer portion. At least one inductor is defined using the inductor electrode, and the inductor is connected between the two outer terminals, and the at least one inductor is connected to the capacitor electrode. The capacitor electrode can define a capacitor by being disposed opposite an external metal shield.

The capacitor electrode can be on the top surface of the multilayer body. Alternatively, the capacitor electrode can be on at least one of the side surfaces of the multilayer body. The capacitor electrode may be on both the top surface and at least one of the side surfaces of the multilayer body.

The multilayer element may further include a high dielectric constant layer covering the capacitor electrode on the top surface and/or at least one of the side surfaces, the high dielectric constant layer being made of a material with a dielectric constant higher than the multilayer body. In this case, in an LC filter made using the multilayer element, a capacitance defined between the capacitor electrode of the multilayer element and a metal shield can be increased.

The outer terminals can be, for example, on the mounting surface of the multilayer body.

It is also preferable that at least one of the base layers is magnetic. This can increase the inductance value of the inductor generated internally.

It is also preferable that the inductor and the capacitor electrode are provided with an additional inductor inserted therebetween. In this case, in an LC filter made using the multilayer element, an LC series resonator can be defined between a signal line and the ground. The LC series resonator can improve the frequency response of the LC filter.

To solve the conventional problems described above, an LC filter according to a preferred embodiment of the present invention includes a multilayer element according to a preferred embodiment of the present invention, and a metal shield. The metal shield covers the multilayer element, and a capacitance generated between the metal shield and the capacitor electrode of the multilayer element defines a capacitor.

It is also preferable that the LC filter further include a resin between the metal shield and the capacitor electrode. This allows a large capacitance to be generated between the metal shield and the capacitor electrode in accordance with the dielectric constant of the resin.

The metal shield and the capacitor electrode may have space (e.g., and air gap) therebetween. This facilitates generation of a capacitance between the metal shield and the capacitor electrode. In this case, for example, a metal structure made by processing a sheet of metal can be used as the metal shield.

The LC filter may further include a substrate, and the multilayer element may be mounted on the substrate. In this case, it is also preferable that the LC filter further include a ground terminal on a lower principal surface of the substrate, and that the metal shield be connected to the ground terminal. This improves the noise reducing capability of the metal shield.

With the multilayer element according to a preferred embodiment of the present invention, an LC filter can be made easily by placing a metal shield opposite the capacitor electrode to form a capacitance between the capacitor electrode and the metal shield.

The multilayer element of a preferred embodiment of the present invention includes only one of capacitor electrodes in a pair that define a capacitor included in an LC filter made by using the multilayer element. This reduces interference between the inductor electrode and the capacitor electrode inside the multilayer body. Therefore, in the multilayer element of a preferred embodiment of the present invention, it is easy to arrange (or design the arrangement of) electrodes inside the multilayer body. In particular, when the capacitor electrode is on the outer portion of the multilayer body, there is no interference between the inductor electrode and the capacitor electrode inside the multilayer body, and this further facilitates the arrangement of electrodes inside the multilayer body. In the multilayer element of a preferred embodiment of the present invention, where the arrangement of electrodes inside the multilayer body is easy, the size of the multilayer body may be reduced.

The LC filters of preferred embodiment of the present invention can be easily made by using the multilayer element of the present invention.

In the LC filters of preferred embodiments of the present invention, the metal shield reduces entry of noise from the outside to inside, and also reduces emission of noise from inside to the outside.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described with reference to the drawings.

The preferred embodiments described herein are merely example preferred embodiments of the present invention, and the present invention is not limited to the preferred embodiments described herein. Techniques described in different preferred embodiments may be carried out in a combined manner, and such combinations are also included in the present invention.

First Preferred Embodiment

Multilayer Element 100

Figure 1A:
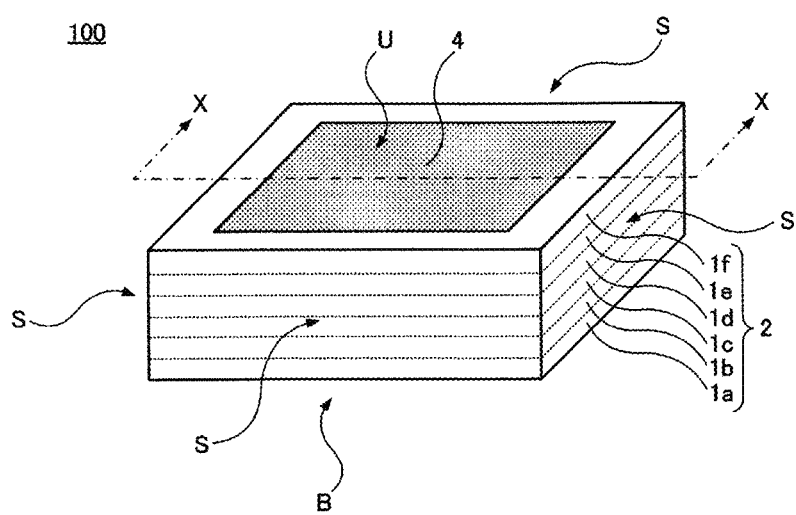
FIG. 1A is a perspective view as viewed from a top surface of a multilayer element 100 according to a first preferred embodiment of the present invention.
Figure 1B:
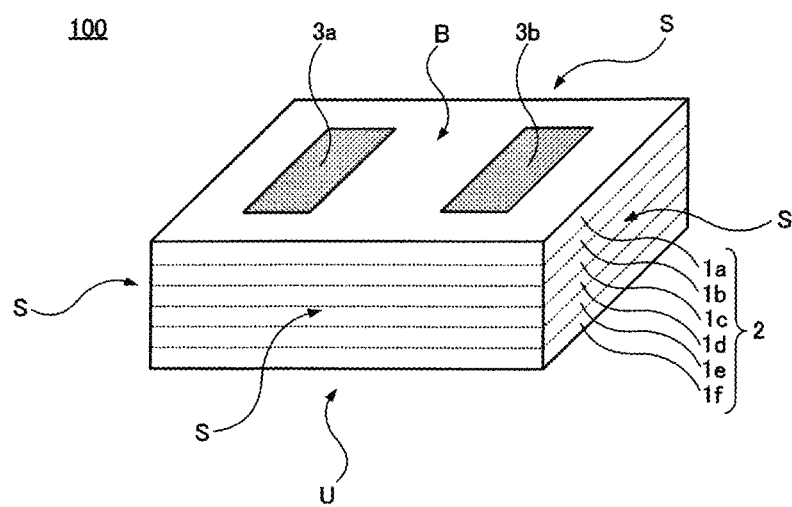
FIG. 1B is a perspective view as viewed from a mounting surface of the multilayer element 100.
Figure 2:
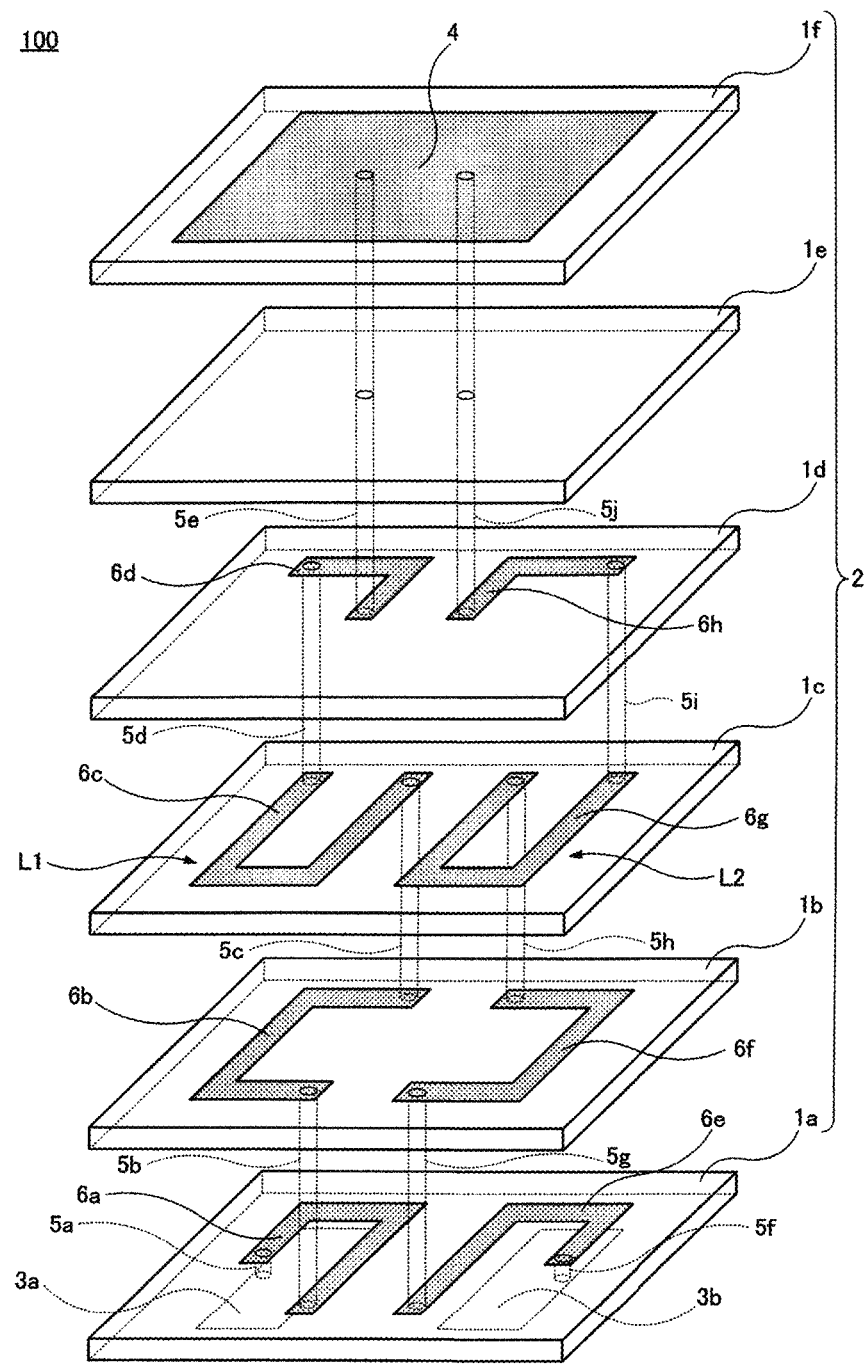
FIG. 2 is an exploded perspective view of the multilayer element 100.
Figure 3A:
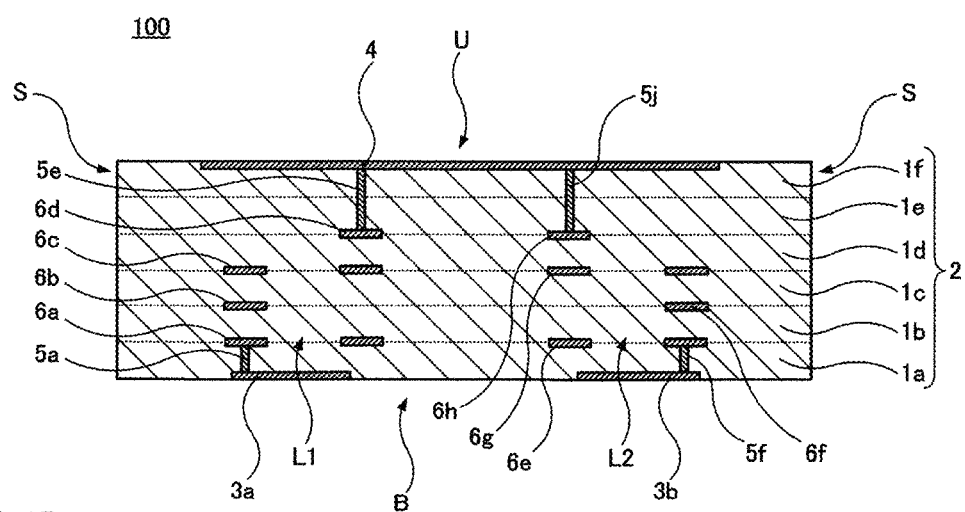
FIG. 3A is a cross-sectional view of the multilayer element 100.
Figure 3B:
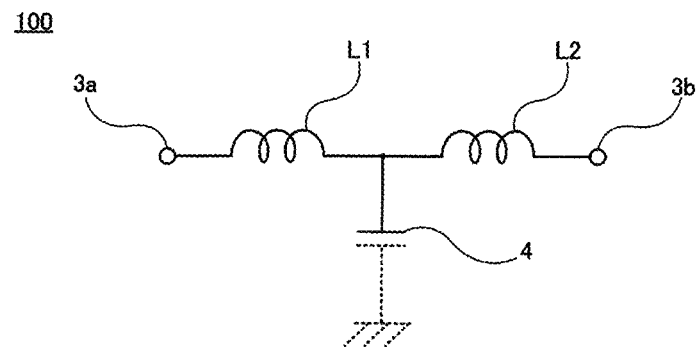
FIG. 3B is an equivalent circuit diagram of the multilayer element 100.

FIGS. 1A and 1B, FIG. 2, and FIGS. 3A and 3B illustrate a multilayer element 100 according to a first preferred embodiment. FIG. 1A is a perspective view of the multilayer element 100 as viewed from a top surface thereof. FIG. 1B is a perspective view of the multilayer element 100 as viewed from a mounting surface thereof. FIG. 2 is an exploded perspective view of the multilayer element 100. FIG. 3A is a cross-sectional view of the multilayer element 100 and illustrates a cross-section taken along dot-and-dash line X-X in FIG. 1A. FIG. 3B is an equivalent circuit diagram of the multilayer element 100.

The multilayer element 100 includes a multilayer body 2 defined by stacking base layers 1a to 1f. In the present preferred embodiment, all the base layers 1a to 1f are preferably made of a magnetic ceramic material. The base layers 1a to 1f are fired into a single member, in which interfaces between adjacent layers may be blended.

The multilayer body 2 includes an outer portion that includes a mounting surface B, a top surface U, and four side surfaces S connecting the mounting surface B to the top surface U.

As illustrated in FIG. 1B, a pair of outer terminals 3a and 3b is provided on the mounting surface B of the multilayer body 2. In the present preferred embodiment, the outer terminals 3a and 3b are preferably made of Ag, for example. The outer terminals 3a and 3b may be made of any material, however, and other types of metals may be used. The outer terminals 3a and 3b may be coated with a plating layer.

As illustrated in FIG. 1A, a capacitor electrode 4 is provided on the top surface U of the multilayer body 2. In the present preferred embodiment, the capacitor electrode 4 is preferably made of Ag, for example. The capacitor electrode 4 may be made of any material, however, and other types of metals may be used. The capacitor electrode 4 may be coated with a plating layer.

Details of the base layers 1a to 1f will now be described with reference to FIG. 2 and FIG. 3A.

The outer terminals 3a and 3b described above are provided on the lower principal surface of the base layer 1a. Via electrodes 5a and 5f penetrate the base layer 1a from one principal surface to the other. Inductor electrodes 6a and 6e are provided on the upper principal surface of the base layer 1a. The via electrode 5a connects the outer terminal 3a to one end of the inductor electrode 6a, and the via electrode 5f connects the outer terminal 3b to one end of the inductor electrode 6e.

Via electrodes 5b and 5g penetrate the base layer 1b from one principal surface to the other. The via electrode 5b is connected to the other end of the inductor electrode 6a, and the via electrode 5g is connected to the other end of the inductor electrode 6e. Inductor electrodes 6b and 6f are provided on the upper principal surface of the base layer 1b. The inductor electrode 6b is connected at one end thereof to the via electrode 5b, and the inductor electrode 6f is connected at one end thereof to the via electrode 5g.

Via electrodes 5c and 5h penetrate the base layer 1c from one principal surface to the other. The via electrode 5c is connected to the other end of the inductor electrode 6b, and the via electrode 5h is connected to the other end of the inductor electrode 6f. Inductor electrodes 6c and 6g are provided on the upper principal surface of the base layer 1c. The inductor electrode 6c is connected at one end thereof to the via electrode 5c, and the inductor electrode 6g is connected at one end thereof to the via electrode 5h.

Via electrodes 5d and 5i penetrate the base layer 1d from one principal surface to the other. The via electrode 5d is connected to the other end of the inductor electrode 6c, and the via electrode 5i is connected to the other end of the inductor electrode 6g. Inductor electrodes 6d and 6h are provided on the upper principal surface of the base layer 1d. The inductor electrode 6d is connected at one end thereof to the via electrode 5d, and the inductor electrode 6h is connected at one end thereof to the via electrode 5i.

Via electrodes 5e and 5j penetrate each of the base layers 1e and 1f from one principal surface to the other. The via electrode 5e is connected to the other end of the inductor electrode 6d, and the via electrode 5j is connected to the other end of the inductor electrode 6h. The capacitor electrode 4 described above is provided on the upper principal surface of the base layer 1f. The via electrodes 5e and 5j are individually connected to the capacitor electrode 4.

In the present preferred embodiment, the via electrodes 5a to 5j and the inductor electrodes 6a to 6h are preferably made of Ag, for example. The via electrodes 5a to 5j and the inductor electrodes 6a to 6h may be made of any material, however, and other types of metals may be used.

The base layers 1a to 1f are stacked to define a single member, the multilayer body 2, in which two inductors L1 and L2 are provided.

The inductor L1 is defined by a conductive path that extends from the outer terminal 3a (starting point) to the capacitor electrode 4 (end point) to sequentially connect the via electrode 5a, the inductor electrode 6a, the via electrode 5b, the inductor electrode 6b, the via electrode 5c, the inductor electrode 6c, the via electrode 5d, the inductor electrode 6d, and the via electrode 5e.

The inductor L2 is defined by a conductive path that extends from the outer terminal 3b (starting point) to the capacitor electrode 4 (end point) to sequentially connect the via electrode 5f, the inductor electrode 6e, the via electrode 5g, the inductor electrode 6f, the via electrode 5h, the inductor electrode 6g, the via electrode 5i, the inductor electrode 6h, and the via electrode 5j.

In the configuration described above, where the inductor L1 and the inductor L2 are connected to the capacitor electrode 4 by the via electrode 5e and the via electrode 5j, respectively, no parasitic inductor is generated between the inductor L1 and the inductor L2. Also, since current passing through the inductor L1 and the inductor L2 flows in the capacitor electrode 4 having a large area, the resistance value of internal wires can be reduced.

The multilayer element 100 configured as described above preferably has the equivalent circuit illustrated in FIG. 3B. That is, the inductor L1 is connected between the outer terminal 3a and the capacitor electrode 4, and the inductor L2 is connected between the outer terminal 3b and the capacitor electrode 4.

In the multilayer element 100, where the capacitor electrode 4 is provided on the outer portion (top surface U) of the multilayer body 2, only the inductors L1 and L2 are provided inside the multilayer body 2. This facilitates arrangement of electrodes inside the multilayer body 2 in the multilayer element 100. At the same time, the multilayer body 2 is reduced in size.

In the multilayer element 100, where the base layers 1a to 1f are made of a magnetic ceramic material, the inductors L1 and L2 have large inductance values. The inductors L1 and L2 may have any inductance values. The inductance values may be increased or decreased, for example, by varying the number of base layers to increase or decrease the number of inductor electrodes.

Example of Method for Manufacturing Multilayer Element 100

The multilayer element 100 can preferably be manufactured, for example, by the following non-limiting example method.

First, ceramic green sheets for making the base layers 1a to 1f are prepared. The ceramic green sheets are primarily made of, for example, a magnetic ferrite material.

Next, holes used in forming the via electrodes 5a to 5j are made in predetermined ones of the ceramic green sheets, for example, by laser beam irradiation.

Next, the holes used in forming the via electrodes 5a to 5j are filled with conductive paste. Next, conductive paste patterns used in forming the outer terminals 3a and 3b, the capacitor electrode 4, and the inductor electrodes 6a to 6h are formed, for example, by screen printing with conductive paste onto the principal surfaces of the ceramic green sheets.

After being stacked in a predetermined order, the ceramic green sheets are, for example, pressed and heated to form a single unfired multilayer body.

Then, the unfired multilayer body is fired under a predetermined profile to make the multilayer body 2. The inductors L1 and L2 are formed inside the multilayer body 2. The outer terminals 3a and 3b and the capacitor electrode 4 are formed on the outer portion of the multilayer body 2.

Last, outer terminals 3a and 3b and the capacitor electrode 4 are coated with a plating layer, as necessary, to complete the multilayer element 100.

Although the above description has described manufacture of one multilayer element 100, a mother ceramic green sheet including ceramic green sheets arranged in a matrix may be prepared to manufacture many multilayer elements 100 at the same time. In this case, the multilayer elements 100 are separated into individual pieces during the process.

LC Filter 150

An LC filter 150 according to the first preferred embodiment will now be described. The LC filter 150 is made using the multilayer element 100 according to the first preferred embodiment described above.

Figure 4A:
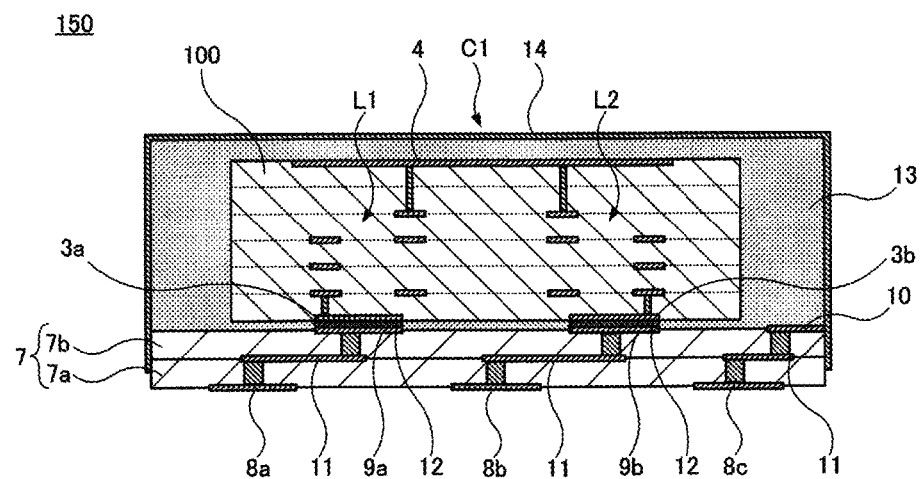
FIG. 4A is a cross-sectional view of an LC filter 150 according to the first preferred embodiment of the present invention.
Figure 4B:
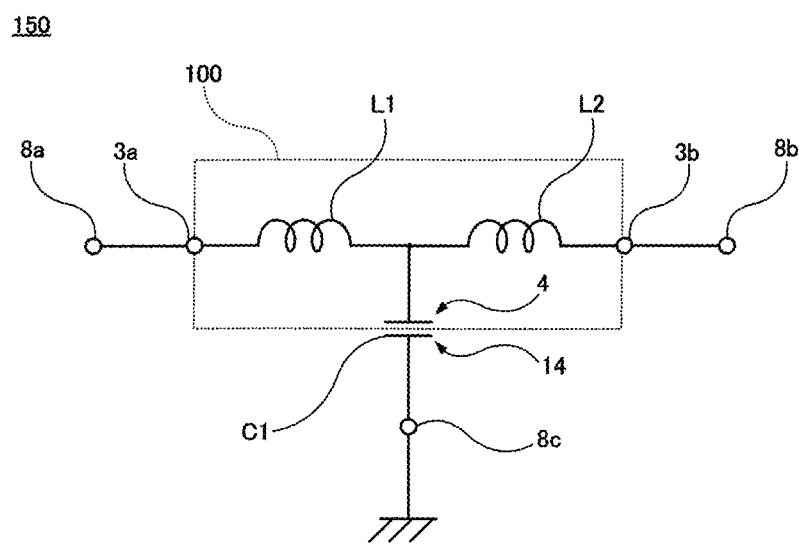
FIG. 4B is an equivalent circuit diagram of the LC filter 150.

FIGS. 4A and 4B illustrate the LC filter 150. Specifically, FIG. 4A is a cross-sectional view of the LC filter 150, and FIG. 4B is an equivalent circuit diagram of the LC filter 150.

The LC filter 150 includes a substrate 7. In the present preferred embodiment, a multilayer substrate defined by stacking a plurality of ceramic layers 7a and 7b is used as the substrate 7. The substrate 7 may be made of any material and, for example, a resin material may be used instead of a ceramic material. The substrate 7 does not necessarily need to be a multilayer substrate, and may be a single-layer substrate.

Three outer terminals 8a, 8b, and 8c are provided on the lower principal surface of the substrate 7. The outer terminals 8a and 8b each are an input and output terminal connected to a signal line. The outer terminal 8c is a ground terminal connected to the ground.

Land electrodes 9a and 9b are provided on the upper principal surface of the substrate 7. A connection electrode 10 connected to a metal shield 14 (described below) is also provided on the upper principal surface of the substrate 7.

The substrate 7 includes wiring electrodes 11 therein. The wiring electrodes 11 are each defined by via electrodes which penetrate the respective ceramic layers 7a and 7b from one principal surface to the other, and an interlayer electrode between the ceramic layers 7a and 7b. One of the wiring electrodes 11 connects the outer terminal 8a to the land electrode 9a, another of the wiring electrodes 11 connects the outer terminal 8b to the land electrode 9b, and the other wiring electrode 11 connects the outer terminal 8c to the connection electrode 10.

The outer terminals 8a, 8b, and 8c, the land electrodes 9a and 9b, the connection electrode 10, and the wiring electrodes (each including via electrodes and interlayer electrode) 11 may be made of any material and, for example, Cu or Ni may preferably be used here. The outer terminals 8a, 8b, and 8c, the land electrodes 9a and 9b, and the connection electrode 10 may each be coated with a plating layer. The plating layer may be made of any material and may have any structure. For example, the plating layer may have a two-layer structure including an Ni plating layer defining a first layer and an Sn plating layer defining a second layer.

The multilayer element 100 is mounted by solder 12 to the upper principal surface of the substrate 7. More specifically, the outer terminal 3a of the multilayer element 100 is preferably joined by the solder 12 to the land electrode 9a, and the outer terminal 3b of the multilayer element 100 is joined by the solder 12 to the land electrode 9b. Instead of the solder 12, for example, a conductive adhesive may be used to mount the multilayer element 100.

A sealing resin 13 is provided on the upper principal surface of the substrate 7 including the multilayer element 100 mounted thereon, in such a manner as to cover the multilayer element 100. In the present preferred embodiment, an epoxy resin having a dielectric constant, for example, of about 3.5 to about 5.0 and also having at least one of thermosetting and photocurable properties, is used as the sealing resin 13. An insulating resin of any type may be selected for use as the sealing resin 13 and, for example, a silicone resin may be used here. Also, the sealing resin 13 may have any dielectric constant.

The metal shield 14 covers the outer portion of the sealing resin 13. In the present preferred embodiment, the metal shield 14 also covers a portion of the end surface of the substrate 7.

In the present preferred embodiment, the metal shield 14 is preferably defined by three layers: a contact layer, a conductive layer, and a protective layer (which are not shown). The three layers preferably have a total thickness of about 100 µm, for example. If the metal shield 14 firmly adheres to the sealing resin 13, the contact layer may be omitted. The contact layer and the protective layer may be made of such a material as SUS, Ti, Cr, or Ni, for example. The conductive layer may be made of such a material as Cu, Ag, or Al, for example.

The metal shield 14 is connected to the connection electrode 10 on the upper principal surface of the substrate 7. As described above, the connection electrode 10 is connected by the wiring electrode 11 to the outer terminal 8c, which is a ground terminal formed on the lower principal surface of the substrate 7. This means that the metal shield 14 is grounded.

In the present preferred embodiment, the distance between the capacitor electrode 4 on the top surface U of the multilayer element 100 and the metal shield 14, that is, the thickness of the sealing resin 13 interposed between the capacitor electrode 4 and the metal shield 14, is preferably set to about 50 µm, for example.

In the LC filter 150, a capacitance generated between the capacitor electrode 4 on the top surface U of the multilayer element 100 and the metal shield 14 defines a capacitor C1. The LC filter 150 thus has the equivalent circuit illustrated in FIG. 4B.

Figure 5A:
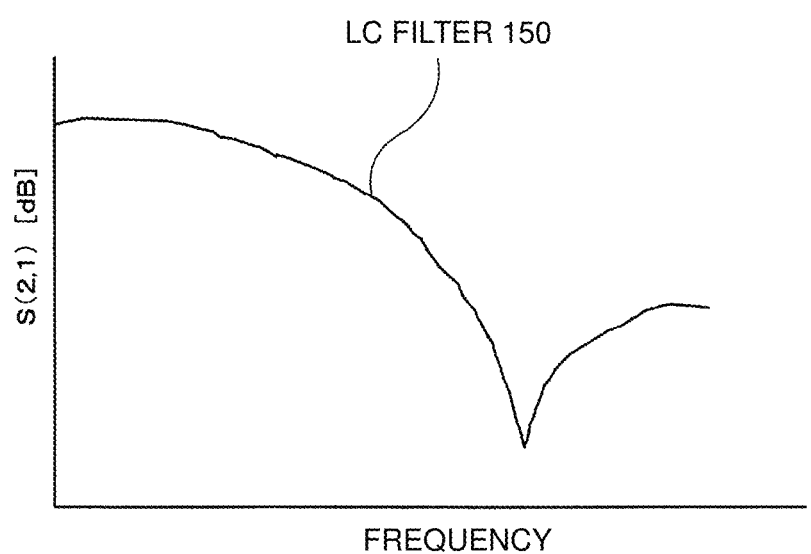
FIG. 5A is a diagram showing a frequency response of the LC filter 150.

The LC filter 150 defines a T-type low pass filter. FIG. 5A schematically shows a frequency response of the LC filter 150.

Figure 5B:
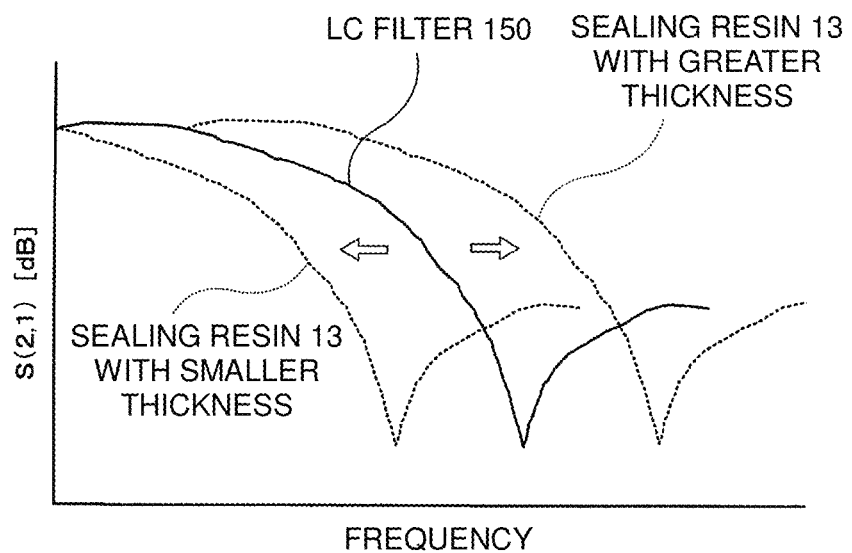
FIG. 5B is a diagram showing how the frequency response of the LC filter 150 is changed by varying the thickness of a sealing resin 13.

The frequency response of the LC filter 150 can be adjusted by increasing or decreasing the thickness of the sealing resin 13 between the capacitor electrode 4 and the metal shield 14. That is, as illustrated in FIG. 5B, the resonant frequency can be shifted to the lower frequency side by decreasing the thickness of the sealing resin 13 and increasing the capacitance value of the capacitor C1. Conversely, the resonant frequency can be shifted to the higher frequency side by increasing the thickness of the sealing resin 13 and decreasing the capacitance value of the capacitor C1.

Example of Method for Manufacturing LC Filter 150

The LC filter 150 can preferably be manufactured, for example, by the following non-limiting example method.

First, the substrate 7 is prepared. The substrate 7 includes the outer terminals 8a, 8b, and 8c, the land electrodes 9a and 9b, the connection electrode 10, and the wiring electrodes 11 which are formed in advance.

Next, the multilayer element 100 is mounted on the land electrodes 9a and 9b on the substrate 7. Specifically, solder paste is first applied to the land electrodes 9a and 9b. Next, the outer terminals 3a and 3b of the multilayer element 100 are placed on the solder paste applied to the land electrodes 9a and 9b. Next, the solder paste is melted by heating, and then solidified by cooling to form the solder 12, by which the outer terminals 3a and 3b are joined to the land electrodes 9a and 9b, respectively.

Next, the sealing resin 13 is formed on the upper principal surface of the substrate 7 having the multilayer element 100 mounted thereon. Specifically, first, an uncured resin is placed on the upper principal surface of the substrate 7 with the multilayer element 100 mounted thereon. Then, by application of at least heat or light, the resin is cured to form the sealing resin 13.

Last, the metal shield 14 is preferably formed, for example, by sputtering in such a manner as to cover the outer portion of the sealing resin 13 and a portion of the end face of the substrate 7 to complete the LC filter 150.

Although the above description has described manufacture of one LC filter 150, a mother substrate having substrates 7 arranged in a matrix may be prepared so as to manufacture many LC filters 150 at the same time. In this case, after the sealing resin 13 is formed on the mother substrate, the LC filters 150 are separated into individual pieces.

Second Preferred Embodiment: LC Filter 250

Figure 6:
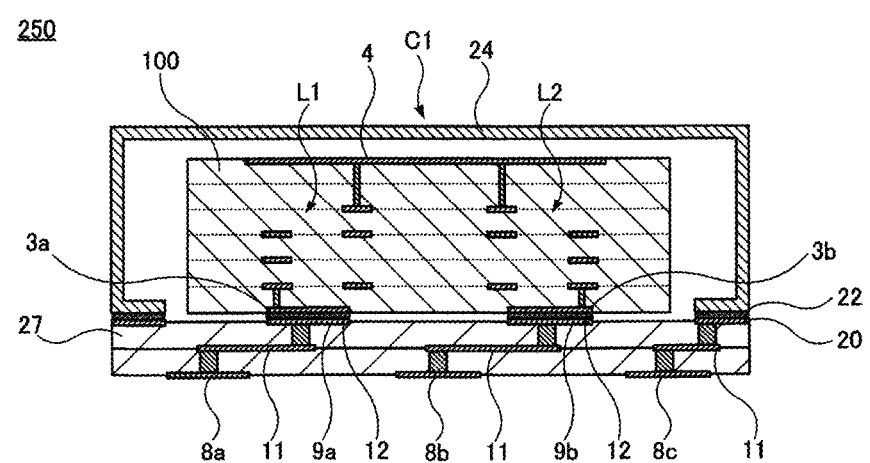
FIG. 6 is a cross-sectional view of an LC filter 250 according to a second preferred embodiment of the present invention.

FIG. 6 illustrates an LC filter 250 according to a second preferred embodiment. FIG. 6 is a cross-sectional view of the LC filter 250.

Like the LC filter 150 according to the first preferred embodiment, the LC filter 250 uses the multilayer element 100 according to the first preferred embodiment. Unlike the LC filter 150, however, the LC filter 250 does not include the sealing resin 13 and the metal shield 14 provided on the outer portion of the sealing resin 13. Instead, the LC filter 250 uses, as the metal shield, a metal structure 24 made by processing a sheet of metal. The following provides a brief description mainly of differences between the LC filter 250 and the LC filter 150.

The LC filter 250 includes a substrate 27. The substrate 7 of the LC filter 150 according to the first preferred embodiment preferably includes the connection electrode 10 provided on a portion of the upper principal surface thereof. On the other hand, the substrate 27 of the LC filter 250 preferably includes an annular connection electrode 20 near the outer edge of the upper principal surface thereof. The connection electrode 20 is connected by the wiring electrode 11 to the outer terminal 8c, which is a ground terminal.

The multilayer element 100 is mounted on the upper principal surface of the substrate 27.

As described above, the LC filter 250 preferably includes, as the metal shield, the metal structure 24 made by processing a sheet of metal. The metal structure 24 is joined by solder 22 to the connection electrode 20 provided on the upper principal surface of the substrate 27.

The LC filter 250 preferably includes space (e.g., an air gap) between the capacitor electrode 4 on the top surface of the multilayer element 100 and the metal structure 24. In the present preferred embodiment, the distance between the capacitor electrode 4 and the metal structure 24 is preferably set to about 50 μm, for example, which is the same as the thickness of the sealing resin 13 interposed between the capacitor electrode 4 and the metal shield 14 of the LC filter 150 according to the first preferred embodiment.

In the LC filter 250, a capacitance generated between the capacitor electrode 4 and the metal structure 24 defines the capacitor C1. The equivalent circuit of the LC filter 250 is the same as or similar to the equivalent circuit of the LC filter 150 illustrated in FIG. 4B. However, in the LC filter 250, where space (dielectric constant=1) existing between the capacitor electrode 4 and the metal structure 24 is used as a dielectric of the capacitor C1, the capacitance value of the capacitor C1 is smaller than that in the LC filter 150 where the sealing resin 13 (dielectric constant=about 3.5 to about 5.0) between the capacitor electrode 4 and the metal shield 14 is used as a dielectric of the capacitor C1.

Third Preferred Embodiment: Multilayer Element 300

Figure 7:
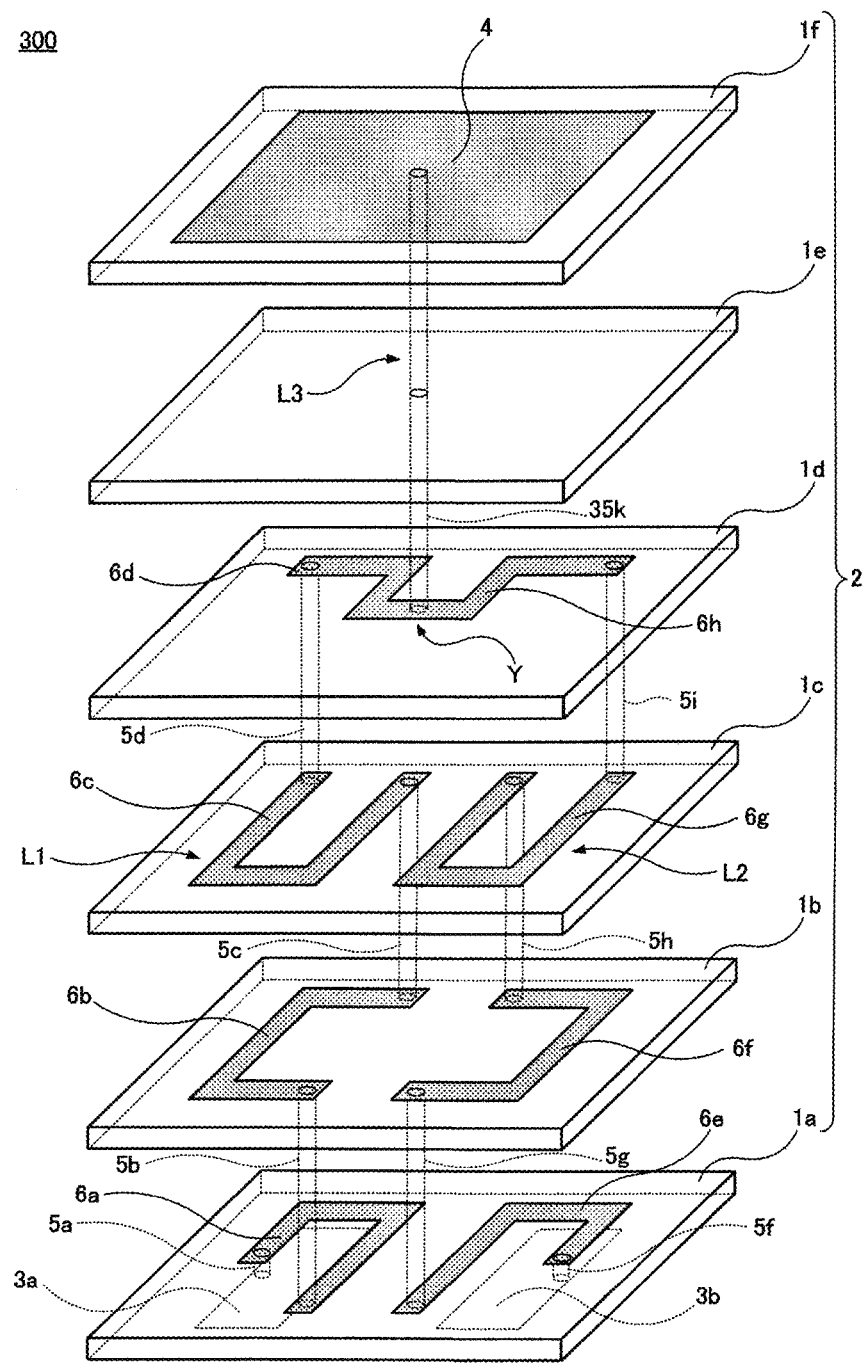
FIG. 7 is an exploded perspective view of a multilayer element 300 according to a third preferred embodiment of the present invention.
Figure 8A:
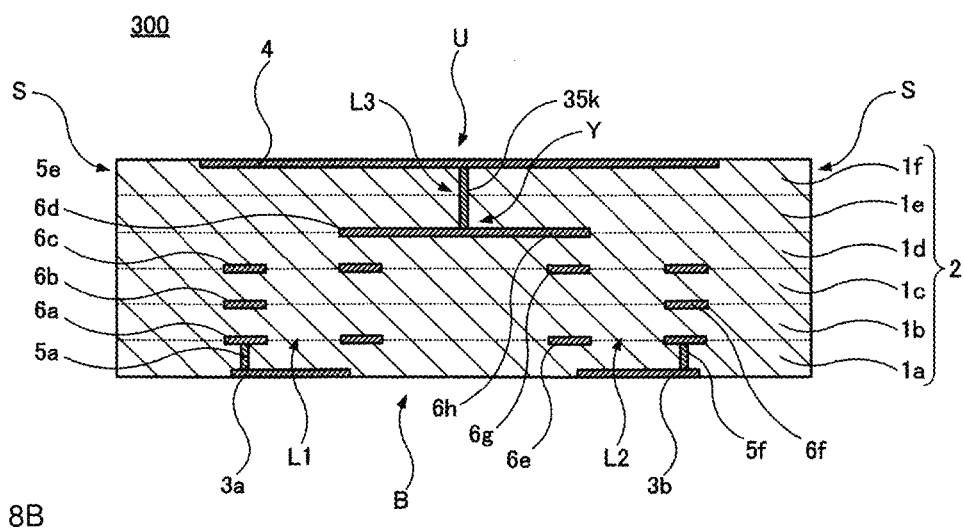
FIG. 8A is a cross-sectional view of the multilayer element 300.
Figure 8B:
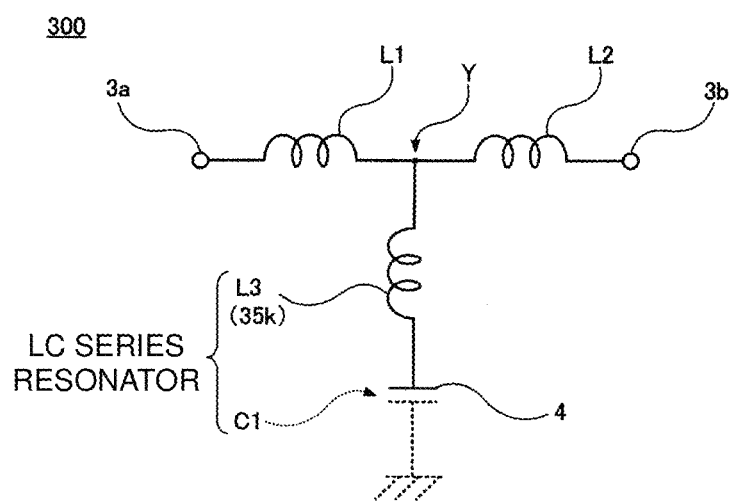
FIG. 8B is an equivalent circuit diagram of the multilayer element 300.

FIG. 7 and FIGS. 8A and 8B illustrate a multilayer element 300 according to a third preferred embodiment. FIG. 7 is an exploded perspective view of the multilayer element 300. FIG. 8A is a cross-sectional view of the multilayer element 300. FIG. 8B is an equivalent circuit diagram of the multilayer element 300.

The multilayer element 300 is preferably obtained by modifying the configuration of the multilayer element 100 according to the first preferred embodiment. Specifically, in the multilayer element 100, as illustrated in FIG. 2 and FIG. 3A, the inductor L1 is defined by the via electrode 5a, the inductor electrode 6a, the via electrode 5b, the inductor electrode 6b, the via electrode 5c, the inductor electrode 6c, the via electrode 5d, the inductor electrode 6d, and the via electrode 5e, and the inductor L2 formed by the via electrode 5f, the inductor electrode 6e, the via electrode 5g, the inductor electrode 6f, the via electrode 5h, the inductor electrode 6g, the via electrode 5i, the inductor electrode 6h, and the via electrode 5j, are individually connected to the capacitor electrode 4. On the other hand, in the multilayer element 300, as illustrated in FIG. 7 and FIG. 8A, the inductor electrode 6d of the inductor L1 and the inductor electrode 6h of the inductor L2, on the upper principal surface of the base layer 1d, are connected to each other at a node Y, and then connected to the capacitor electrode 4 by a via electrode 35k penetrating the base layers 1e and 1f.

In the multilayer element 300, as illustrated in FIG. 8B, the via electrode 35k defines an inductor L3 between the capacitor electrode 4 and the node Y of the inductor L1 and the inductor L2. Because of the reduced inductor lengths, the inductance values of the inductors L1 and L2 of the multilayer element 300 are smaller than the inductance values of the inductors L1 and L2 of the multilayer element 100.

When the multilayer element 300 is used to define an LC low pass filter with a method the same as or similar to that for the LC filter 150 according to the first preferred embodiment or with a method similar to that for the LC filter 250 according to the second preferred embodiment, the inductor L3 and the capacitor C1 define an LC series resonator as illustrated in FIG. 8B. With this LC series resonator, the LC low pass filter defined using the multilayer element 300 improves attenuation of frequencies higher than the pass band.

Fourth Preferred Embodiment: Multilayer Element 400

Figure 9:
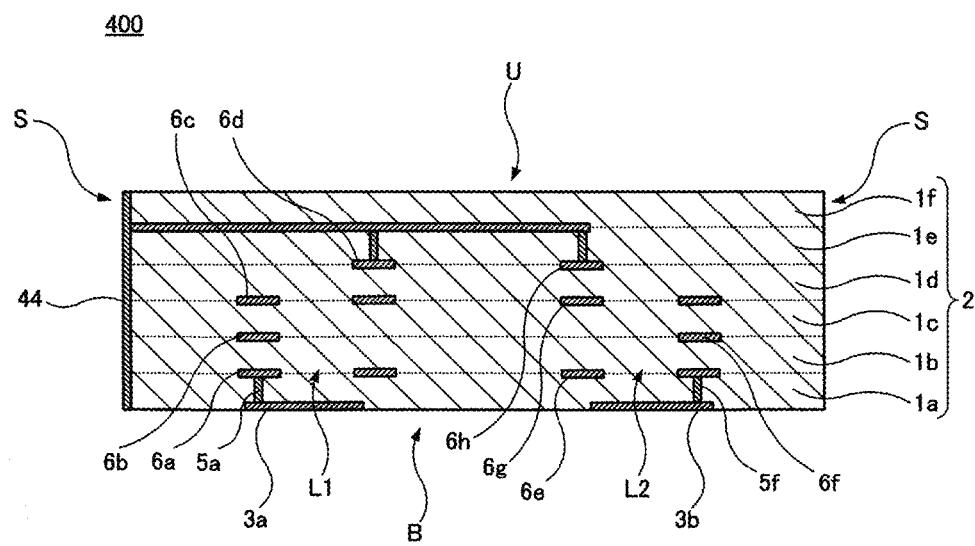
FIG. 9 is a cross-sectional view of a multilayer element 400 according to a fourth preferred embodiment of the present invention.

FIG. 9 illustrates a multilayer element 400 according to a fourth preferred embodiment. FIG. 9 is a cross-sectional view of the multilayer element 400.

The multilayer element 400 is preferably obtained by modifying the configuration of the multilayer element 100 according to the first preferred embodiment. Specifically, in the multilayer element 100, the capacitor electrode 4 is provided on the top surface U of the multilayer body 2. In the multilayer element 400, on the other hand, a capacitor electrode 44 is provided on the side surface S of the multilayer body 2. Then, the inductor electrode 6d of the inductor L1 and the inductor electrode 6h of the inductor L2 are each connected by the via electrode and the interlayer electrode formed between the base layers to the capacitor electrode 44.

As described above, the capacitor electrode 44 may be provided on the side surface S of the multilayer body 2. The multilayer element 400 can be used to make an LC filter with a method the same as or similar to that for the LC filter 150 according to the first preferred embodiment or with a method the same as or similar to that for the LC filter 250 according to the second preferred embodiment.

Fifth Preferred Embodiment: Multilayer Element 500

Figure 10:
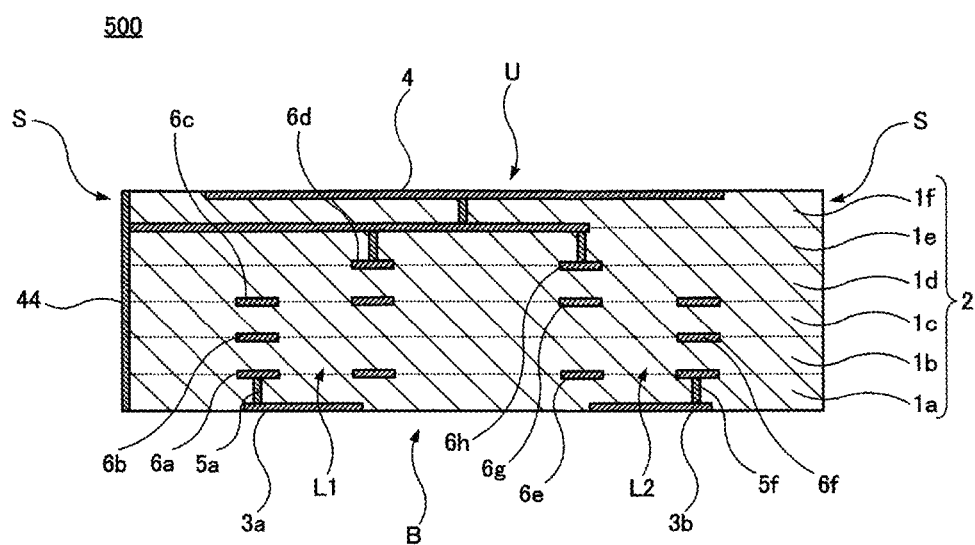
FIG. 10 is a cross-sectional view of a multilayer element 500 according to a fifth preferred embodiment of the present invention.

FIG. 10 illustrates a multilayer element 500 according to a fifth preferred embodiment. FIG. 10 is a cross-sectional view of the multilayer element 500.

In the multilayer element 500, the capacitor electrode 4 is provided on the top surface U of the multilayer body 2 and, at the same time, the capacitor electrode 44 is provided on the side surface S of the multilayer body 2. Then, the inductor electrode 6d of the inductor L1 and the inductor electrode 6h of the inductor L2 are connected to both the capacitor electrode 4 and the capacitor electrode 44 by the via electrodes and the interlayer electrode provided between the base layers.

As described above, the plurality of capacitor electrodes 4 and 44 may be provided on the outer portion of the multilayer body 2. The multilayer element 500 can be used to make an LC filter with a method the same as or similar to that for the LC filter 150 according to the first preferred embodiment or with a method the same as or similar to that for the LC filter 250 according to the second preferred embodiment.

Sixth Preferred Embodiment: Multilayer Element 600

Figure 11A:
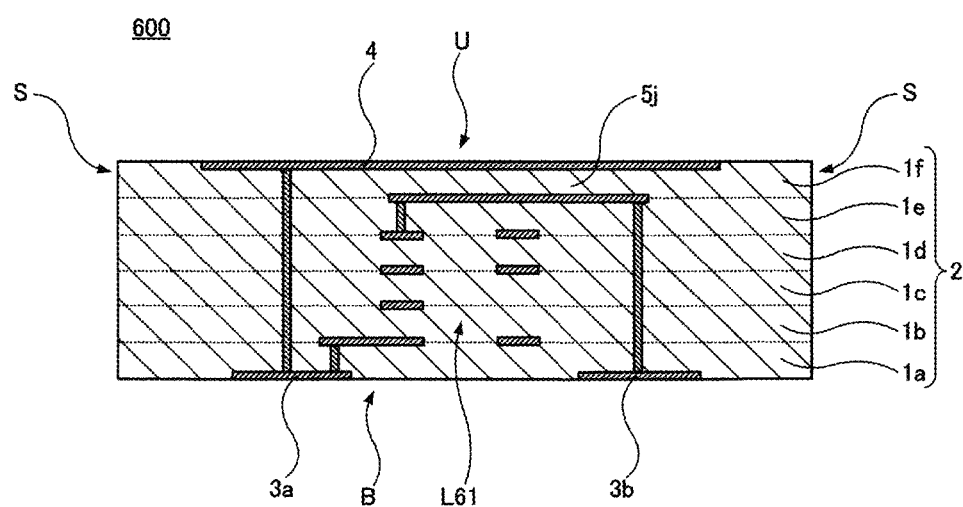
FIG. 11A is a cross-sectional view of a multilayer element 600 according to a sixth preferred embodiment of the present invention.
Figure 11B:
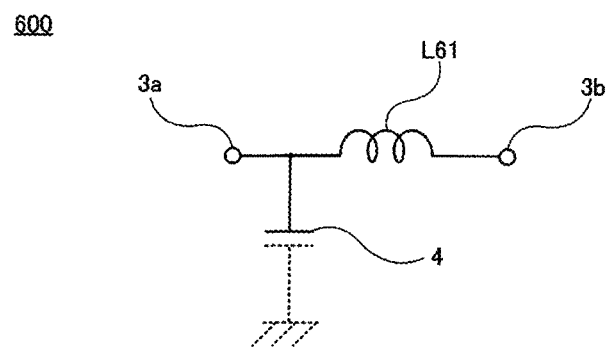
FIG. 11B is an equivalent circuit diagram of the multilayer element 600.

FIGS. 11A and 11B illustrate a multilayer element 600 according to a sixth preferred embodiment. Specifically, FIG. 11A is a cross-sectional view of the multilayer element 600, and FIG. 11B is an equivalent circuit diagram of the multilayer element 600.

In the multilayer element 600, one inductor L61 is provided inside the multilayer body 2 by via electrodes and inductor electrodes. The inductor L61 is preferably connected at one end portion thereof to the outer terminal 3a, and connected at the other end portion thereof to the outer terminal 3b. The outer terminal 3a is connected by a via electrode to the capacitor electrode 4 provided on the top surface U of the multilayer body 2.

When the multilayer element 600 is used to define an LC filter with a method the same as or similar to that for the LC filter 150 according to the first preferred embodiment or with a method the same as or similar to that for the LC filter 250 according to the second preferred embodiment, an L-type filter is provided as illustrated in FIG. 11B.

Seventh Preferred Embodiment: Multilayer Element 700

Figure 12A:
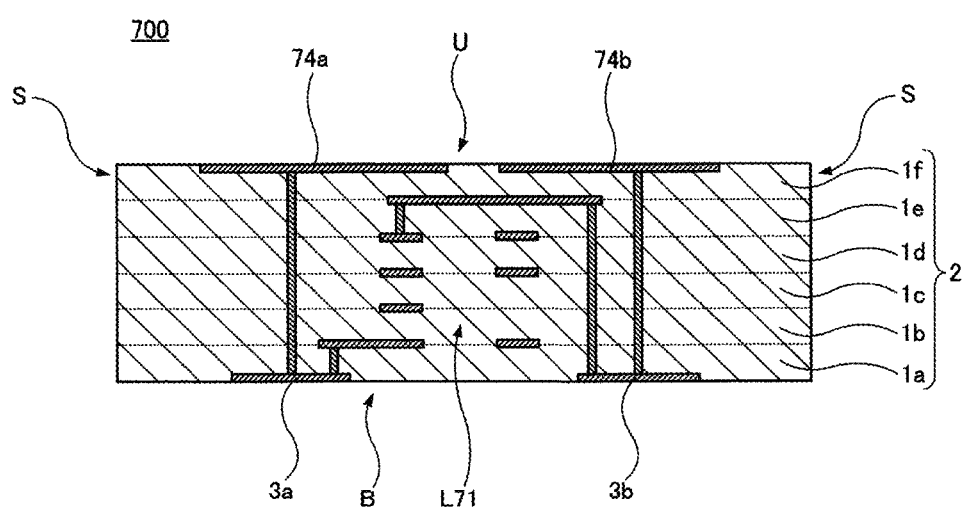
FIG. 12A is a cross-sectional view of a multilayer element 700 according to a seventh preferred embodiment of the present invention.
Figure 12B:
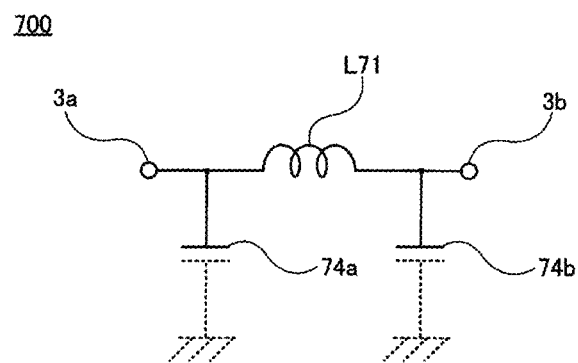
FIG. 12B is an equivalent circuit diagram of the multilayer element 700.

FIGS. 12A and 12B illustrate a multilayer element 700 according to a seventh preferred embodiment. Specifically, FIG. 12A is a cross-sectional view of the multilayer element 700, and FIG. 12B is an equivalent circuit diagram of the multilayer element 700.

In the multilayer element 700, one inductor L71 is provided inside the multilayer body 2 by via electrodes and inductor electrodes. The inductor L71 is preferably connected at one end portion thereof to the outer terminal 3a, and connected at the other end portion thereof to the outer terminal 3b. Two capacitor electrodes 74a and 74b are provided on the top surface U of the multilayer body 2. The outer terminal 3a is connected by a via electrode to the capacitor electrode 74a, and the outer terminal 3b is connected by another via electrode to the capacitor electrode 74b.

When the multilayer element 700 is used to define an LC filter with a method the same as or similar to that for the LC filter 150 according to the first preferred embodiment or with a method the same as or similar to that for the LC filter 250 according to the second preferred embodiment, a π-type filter is defined as illustrated in FIG. 12B.

Eighth Preferred Embodiment: Multilayer Element 800

Figure 13:
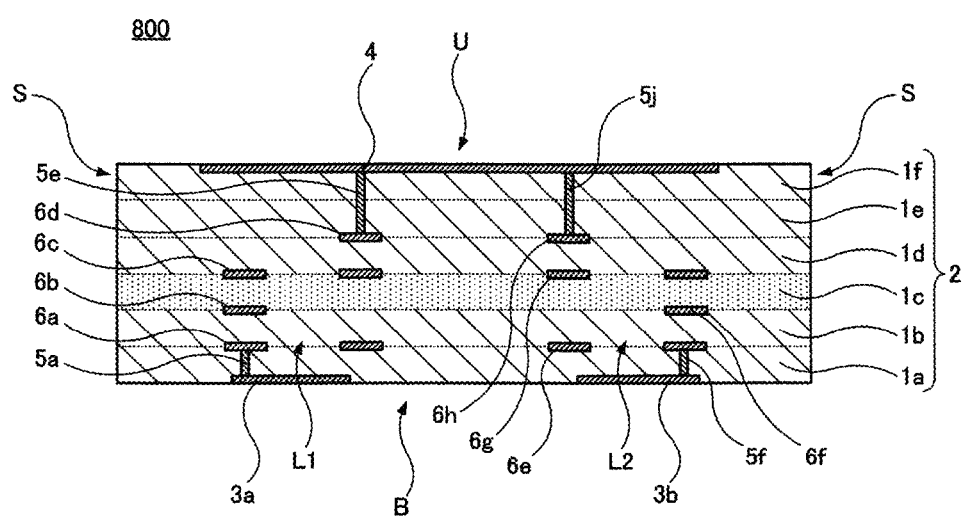
FIG. 13 is a cross-sectional view of a multilayer element 800 according to an eighth preferred embodiment of the present invention.

FIG. 13 illustrates a multilayer element 800 according to an eighth preferred embodiment. FIG. 13 is a cross-sectional view of the multilayer element 800.

The multilayer element 800 is preferably obtained by modifying the configuration of the multilayer element 100 according to the first preferred embodiment. Specifically, in the multilayer element 100, all the base layers 1a to 1f of the multilayer body 2 are preferably made of a magnetic ceramic material. In the multilayer element 800, on the other hand, only the base layer 1c is preferably made of a non-magnetic ceramic material.

In the multilayer element 800, where the base layer 1c is made of a non-magnetic ceramic material, the direct-current superimposing characteristics of both the inductor L1 and the inductor L2 are improved. The multilayer element 800 can be used to make an LC filter with a method the same as or similar to that for the LC filter 150 according to the first preferred embodiment or with a method the same as or similar to that for the LC filter 250 according to the second preferred embodiment.

Ninth Preferred Embodiment: Multilayer Element 900

Figure 14:
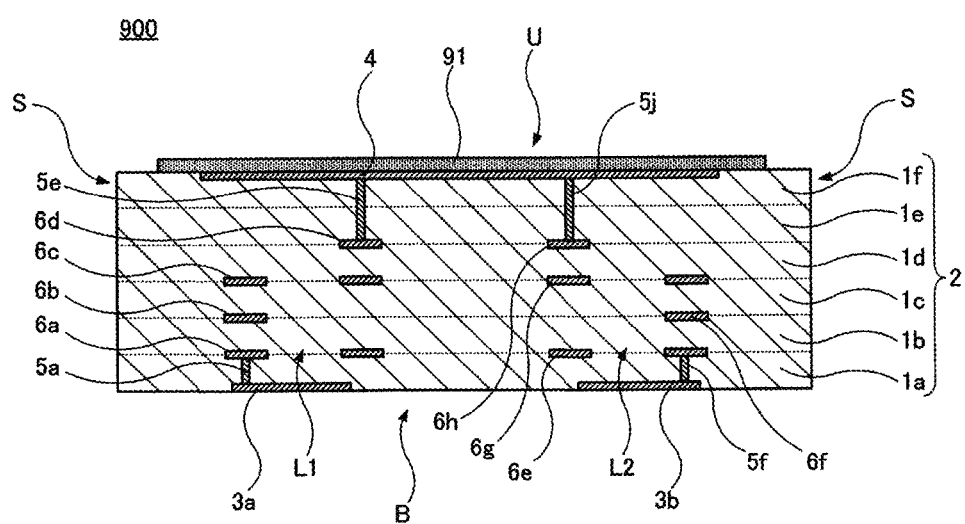
FIG. 14 is a cross-sectional view of a multilayer element 900 according to a ninth preferred embodiment of the present invention.

FIG. 14 illustrates a multilayer element 900 according to a ninth preferred embodiment. FIG. 14 is a cross-sectional view of the multilayer element 900.

The multilayer element 900 is preferably obtained by adding a component to the multilayer element 100 according to the first preferred embodiment. Specifically, the multilayer element 900 includes a high dielectric constant layer 91 covering the capacitor electrode 4 disposed on the top surface U of the multilayer body 2. The high dielectric constant layer 91 is made of a material with a dielectric constant higher than the multilayer body 2 (base layers 1a to 1f). In the present preferred embodiment, for example, a dielectric material with a dielectric constant of about 50 or higher is preferably used for the high dielectric constant layer 91. After the multilayer body 2 is made by firing, the dielectric material is applied to the top surface U of the multilayer body 2 to form the high dielectric constant layer 91. The dielectric constant of the multilayer body 2 (base layers 1a to 1f) made of a magnetic ceramic material is about 10 to 15.

The multilayer element 900 thus includes the high dielectric constant layer 91 on the top surface U of the multilayer body 2 to cover the capacitor electrode 4. This enables the capacitor C1 to have a large capacitance value when an LC filter is made by a method the same as or similar to that for the LC filter 150 according to the first preferred embodiment or by a method the same as or similar to that for the LC filter 250 according to the second preferred embodiment.

Tenth Preferred Embodiment: Multilayer Element 1000

Figure 15:
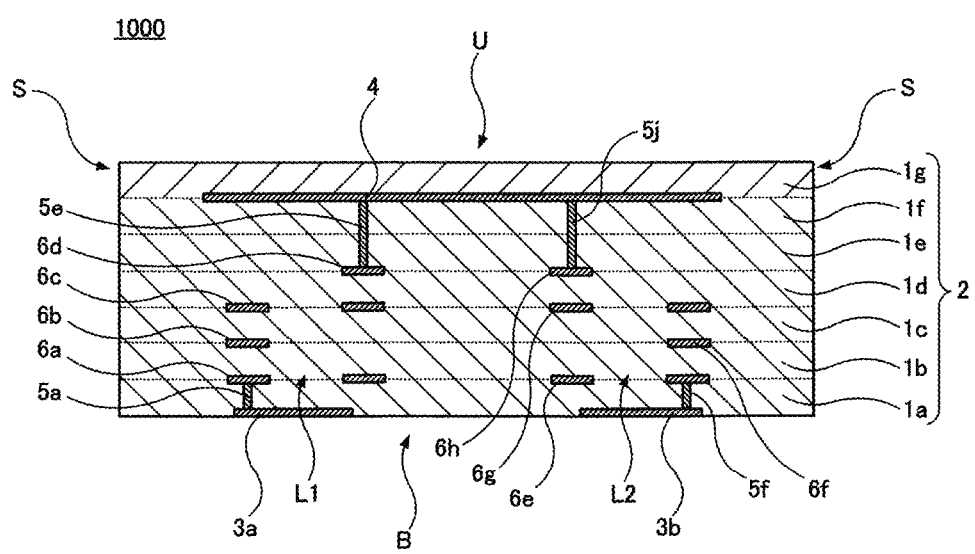
FIG. 15 is a cross-sectional view of a multilayer element 1000 according to a tenth preferred embodiment of the present invention.
Figure 16A:
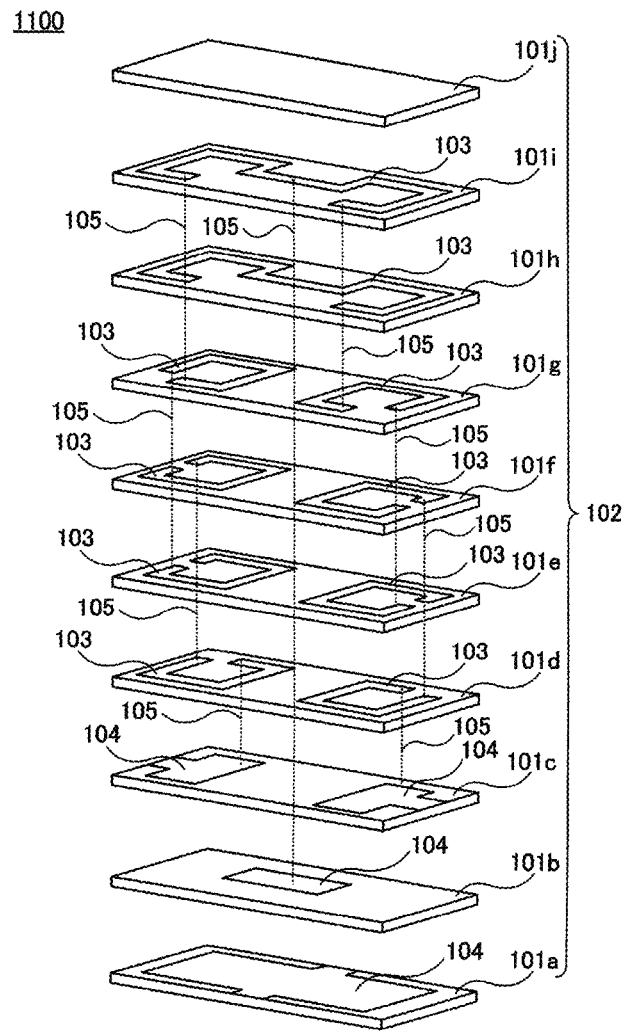
FIG. 16A is an exploded perspective view of an LC filter 1100 disclosed in Japanese Unexamined Patent Application Publication No. 2013-21449.
Figure 16B:
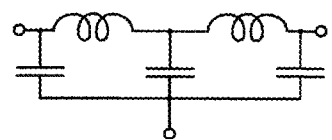
FIG. 16B is an equivalent circuit diagram of the LC filter 1100.

FIG. 15 illustrates a multilayer element 1000 according to a tenth preferred embodiment. FIG. 15 is a cross-sectional view of the multilayer element 1000.

The multilayer element 1000 is preferably obtained by modifying the configuration of the multilayer element 100 according to the first preferred embodiment. Specifically, in the multilayer element 100, the multilayer body 2 includes the six base layers 1a to 1f made of a magnetic ceramic material. In the multilayer element 1000, however, a base layer 1g made of a high dielectric constant ceramic material is added onto the base layer 1f of the multilayer body 2. These seven base layers 1a to 1g are fired to form a single unit, the multilayer body 2. The capacitor electrode 4 is formed between the base layer 1f and the base layer 1g.

A high dielectric constant ceramic material preferably with a dielectric constant of, for example, 20 or more is preferably used to form the base layer 1g. The dielectric constant of the base layers 1a to 1f made of a magnetic ceramic material is preferably about 10 to 15, for example.

In the multilayer element 1000, the base layer 1g made of a high dielectric constant ceramic material is added to the multilayer body 2. This enables the capacitor C1 to have a large capacitance value when an LC filter is made by a method the same as or similar to that for the LC filter 150 according to the first preferred embodiment or by a method the same as or similar to that for the LC filter 250 according to the second preferred embodiment.

The multilayer elements 100, 300, 400, 500, 600, 700, 800, 900, and 1000 according to the first to tenth preferred embodiments, the LC filter 150 according to the first preferred embodiment, and the LC filter 250 according to the second preferred embodiment, have been described. The present invention is not limited to the preferred embodiments described above, and various changes can be made thereto in accordance with the spirit of the invention.

For example, the inductors inside the multilayer body 2 of the multilayer element 100 or the like are not limited to those described above, and any number of inductors may be provided at any positions and connected in any manner. Similarly, for example, the capacitor electrodes provided on or in the multilayer body 2 are not limited to those described above, and any number of capacitor electrodes may be provided at any positions.

Also, for example, the base layers forming the multilayer body 2 of the multilayer element 100 or the like are not limited to those described above, and any number of base layers made of any material may be used.

Also, the method used to make an LC filter using any multilayer element of the present invention may be different from that for the LC filter 150 according to the first preferred embodiment, or for the LC filter 250 according to the second preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer element, comprising:
   a multilayer body including a plurality of base layers that are stacked, the multilayer body including an outer portion including a mounting surface, a top surface, and a plurality of side surfaces connecting the mounting surface to the top surface;
   at least one inductor electrode between adjacent ones of the plurality of base layers;
   at least one capacitor electrode on the outer portion or between adjacent ones of the plurality of base layers to be closer to the top surface than the at least one inductor electrode is; and
   at least two outer terminals connected to an external connector, the at least two outer terminals being on the outer portion; wherein
   at least one inductor is defined by the at least one inductor electrode;
   the at least one inductor is connected between the at least two outer terminals, and the at least one inductor is connected to the at least one capacitor electrode; and
   the at least one capacitor electrode is configured to define at least one capacitor with at least one other capacitor electrode located outside of the multilayer element.

2. The multilayer element according to claim 1, wherein the at least one capacitor electrode is on the top surface.

3. The multilayer element according to claim 1, wherein the at least one capacitor electrode is on at least one of the side surfaces.

4. The multilayer element according to claim 1, wherein the at least one inductor is connected between the at least two outer terminals through via electrodes penetrating through the multilayer body.

5. The multilayer element according to claim 1, wherein the at least two outer terminals are on the mounting surface.

6. The multilayer element according to claim 1, wherein at least one of the plurality of base layers is magnetic.

7. The multilayer element according to claim 1, wherein the at least one inductor and the at least one capacitor electrode are provided with an additional inductor inserted therebetween.

8. An LC filter comprising:
   the multilayer element according to claim 1; and
   a metal shield; wherein
   the metal shield covers the multilayer element and includes the at least one other capacitor electrode located outside of the multilayer element; and
   a capacitance generated between the metal shield and the at least one capacitor electrode of the multilayer element defines the at least one capacitor.

9. The LC filter according to claim 8, wherein the metal shield and the at least one capacitor electrode include a space therebetween.

10. The LC filter according to claim 8, further comprising:
    a substrate; wherein
    the multilayer element is mounted on the substrate.

11. The LC filter according to claim 10, wherein the substrate is a multilayer member including internal wiring electrodes.

12. The LC filter according to claim 10, further comprising:
   a ground terminal on a lower principal surface of the substrate; wherein
   the metal shield is connected to the ground terminal.

13. The LC filter according to claim 10, wherein the multilayer element is mounted on an upper surface of the substrate and three terminals are provided on a lower surface of the substrate.

14. The LC filter according to claim 13, wherein land terminals provided on the upper surface of the substrate are connected to the at least two outer terminals.

15. The multilayer element according to claim 1, wherein the at least two outer terminals and the at least one capacitor electrode are coated with a plating layer.

16. A multilayer element comprising:
   a multilayer body including a plurality of base layers that are stacked, the multilayer body including an outer portion including a mounting surface, a top surface, and a plurality of side surfaces connecting the mounting surface to the top surface;
   at least one inductor electrode between adjacent ones of the plurality of base layers;
   at least one capacitor electrode on the top surface;
   at least two outer terminals connected to an external connector, the at least two outer terminals being on the outer portion; and
   a high dielectric constant layer covering the at least one capacitor electrode on the top surface and/or at least one of the side surfaces, the high dielectric constant layer being made of a material with a dielectric constant higher than that of the multilayer body; wherein
   at least one inductor is defined by the at least one inductor electrode; and
   the at least one inductor is connected between the at least two outer terminals, and the at least one inductor is connected to the at least one capacitor electrode.

17. An LC filter comprising:
   a multilayer element including:
      a multilayer body including a plurality of base layers that are stacked, the multilayer body including an outer portion including a mounting surface, a top surface, and a plurality of side surfaces connecting the mounting surface to the top surface;
      at least one inductor electrode between adjacent ones of the plurality of base layers;
      at least one capacitor electrode on the outer portion or between adjacent ones of the plurality of base layers to be closer to the top surface than the at least one inductor electrode is; and
      at least two outer terminals connected to an external connector, the at least two outer terminals being on the outer portion;
   a metal shield; and
   a resin between the metal shield and the at least one capacitor electrode and between the outer portion of the multilayer body and the metal shield; wherein
   at least one inductor is defined by the at least one inductor electrode;
   the at least one inductor is connected between the at least two outer terminals, and the at least one inductor is connected to the at least one capacitor electrode;
   the metal shield covers the multilayer element; and
   a capacitance generated between the metal shield and the at least one capacitor electrode of the multilayer element defines a capacitor.

* * * * *